United States Patent
Loibl et al.

(10) Patent No.: US 9,877,396 B2
(45) Date of Patent: Jan. 23, 2018

(54) METHOD FOR PRODUCING A RECEPTACLE FOR A SENSOR ELEMENT

(71) Applicant: Robert Bosch GmbH, Stuttgart (DE)

(72) Inventors: Thomas Loibl, Oberstdorf (DE); Imke Heeren, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 484 days.

(21) Appl. No.: 14/151,907

(22) Filed: Jan. 10, 2014

(65) Prior Publication Data
US 2014/0196944 A1 Jul. 17, 2014

(30) Foreign Application Priority Data
Jan. 11, 2013 (DE) .................. 10 2013 200 281

(51) Int. Cl.
*H05K 3/00* (2006.01)
*B28B 1/24* (2006.01)
(Continued)

(52) U.S. Cl.
CPC ............. *H05K 3/0014* (2013.01); *G01R 1/04* (2013.01); *H05K 1/0306* (2013.01); *H05K 3/10* (2013.01)

(58) Field of Classification Search
CPC .. H05K 3/0014; H05K 3/1216–3/1275; C04B 2235/6022; B28B 1/24
See application file for complete search history.

(56) References Cited

U.S. PATENT DOCUMENTS 4,164,067 A * 8/1979 Brandt .................. H01C 1/024
29/619
4,345,955 A * 8/1982 Bakermans ........... C04B 35/632
156/89.14
(Continued)

FOREIGN PATENT DOCUMENTS

DE     102008054631 A1 *  6/2010  ......... G01N 27/4067
DE     10 2009 000 463 A1    8/2010
DE     102011082173 A1 *  3/2013  ......... G01N 27/4077

OTHER PUBLICATIONS

Richerson, David W. Modern Ceramic Engineering. New York, Marcel Dekker, Inc., 1992. p. 492.*
(Continued)

*Primary Examiner* — Erin Snelting
(74) *Attorney, Agent, or Firm* — Maginot, Moore & Beck LLP

(57) ABSTRACT

A method for producing a receptacle for a sensor element, such as a combustion chamber pressure sensor, includes introducing a first amount of a pre-ceramic substance into an injection mold, forming a base layer of the receptacle by molding the pre-ceramic substance in the mold, and applying at least one conductor track to the base layer. A further amount of a pre-ceramic substance is introduced into the mold onto at least a partial region of the conductor track. A top region of the receptacle is formed directly on the base layer while at least partially covering over the conductor track by molding the further pre-ceramic substance in the injection mold. The method also includes debinding and sintering the molded body. The method forms a receptacle for a sensor element that has conductor tracks lying on the inside and incorporated in a gas-tight manner in a ceramic body.

14 Claims, 2 Drawing Sheets

(51) Int. Cl.
*G01R 1/04* (2006.01)
*H05K 1/03* (2006.01)
*H05K 3/10* (2006.01)

(56) References Cited

U.S. PATENT DOCUMENTS

| | | | | |
|---|---|---|---|---|
| 4,576,919 | A * | 3/1986 | Hodge | C03C 10/00 264/662 |
| 2010/0155389 | A1* | 6/2010 | Yamamoto | H05B 3/141 219/548 |
| 2010/0289181 | A1* | 11/2010 | Tsutsui | B28B 23/0056 264/272.13 |
| 2012/0058301 | A1* | 3/2012 | Yoshioka | B28B 1/008 428/141 |
| 2012/0214942 | A1* | 8/2012 | Hiraiwa | C04B 35/01 524/871 |
| 2012/0235330 | A1* | 9/2012 | ter Maat | B22F 3/1025 264/645 |

OTHER PUBLICATIONS

DE 10 2008 054631 A1 (Glanz) Jun. 24, 2010 (English language machine translation). [online] [retrieved Jun. 14, 2016]. Retrieved from: Espacenet.*
DE 10 2009 000463 A1 (Loibl) Aug. 5, 2010 (English language machine translation). [online] [retrieved May 31, 2016]. Retrieved from: Espacenet.*
DE 10 2011 082173 A1 (Schubert) Mar. 7, 2013 (English language machine translation). [online] [retrieved Jun. 14, 2016]. Retrieved from: Espacenet.*

* cited by examiner

METHOD FOR PRODUCING A RECEPTACLE FOR A SENSOR ELEMENT

This application claims priority under 35 U.S.C. §119 to patent application no. DE 10 2013 200 281.5 filed on Jan. 11, 2013 in Germany, the disclosure of which is incorporated herein by reference in its entirety.

BACKGROUND

The present disclosure relates to a method for producing a receptacle for a sensor element. The present disclosure also relates to a receptacle for a sensor element.

Sensor elements for detecting a wide variety of substances are widely encountered. For example, there are such known sensor elements acting as directly measuring combustion chamber pressure sensors, for example, which are produced on a semiconductor basis, such as for instance on the basis of a silicon/silicon carbide material combination, and are used at operating temperatures of 500° C. or more, for example, in the exhaust gas of an internal combustion engine. For such sensors or sensor elements, hermetic installation with electrical lead-throughs is of advantage.

The document DE 10 2009 000 463 discloses a method for producing an installation module of a gas sensor. This document consequently relates to a sensor element as such and not to a receptacle suitable for it.

SUMMARY

The subject matter of the present disclosure is a method for producing a receptacle for a sensor element, in particular for a combustion chamber pressure sensor, comprising the method steps of:
  a) introducing a first amount of a pre-ceramic substance into an injection mold;
  b) forming a base layer of the receptacle by molding the pre-ceramic substance in the injection mold;
  c) applying at least one conductor track to the base layer;
  d) introducing a further amount of a pre-ceramic substance into an injection mold, onto at least a partial region of the base layer and of the at least one conductor track;
  e) forming a top region of the receptacle directly on the base layer while at least partially covering over the at least one conductor track by molding the further pre-ceramic substance in the injection mold; and
  f) debinding and sintering the molded body.

The method described above allows a ceramic receptacle for a sensor element, in particular such a receptacle provided with metallic conductor tracks lying on the inside and incorporated in a gas-tight manner, to be provided in a particularly easy and inexpensive way. Such a receptacle may be suitable in particular for a combustion chamber pressure sensor, since the receptacle can withstand high operating temperatures with reliable gas-tight sealing.

In a first method step a), according to the method described above, a first amount of a pre-ceramic substance is introduced into an injection mold. For the purposes of the present disclosure, a pre-ceramic substance may be in particular a substance which can be molded by one or multiple steps to form a ceramic solid body. In this case, the pre-ceramic substance may be a substance that is known per se for ceramic injection molding (CIM). To this extent, the pre-ceramic substance may in particular also take the form of sinterable powder or granules of a suitable grain size, referred to as feedstock, which may in particular comprise oxide, silicate and nitride ceramics or else carbides, and which furthermore may be provided in association with additives, such as in particular a binder material.

The aim of the association with a binder may be in particular a sheathing of all the powder particles with the binder, whereby prevention of agglomerates and the production of particularly homogeneous granules can take place.

In order to mold the pre-ceramic substance, it is introduced into an injection mold.

In a further method step b), a base layer of the receptacle can then be formed by molding the pre-ceramic substance in the injection mold. When doing so, for example, parameters that are known per se for ceramic injection molding may be set. By way of example, and without implying any restriction, melt temperatures in a range up to 200° C., mold temperatures, for instance for cooling the melt, in a range down to 80° C., injection pressures up to 1600 bar, holding pressures up to 1200 bar and/or cycle times in a range of approximately greater than or equal to 20 seconds to less than or equal to 60 seconds may be used. The molded component molded in this way, and also referred to as a green body, serves as a preform.

This molding step allows a separate molded body that is, for example, of a flat form on one side or at a suitable position or else is differently molded, such as for example molded in a wavy form, to be obtained as a base layer for the receptacle. After opening the injection-molding tool, this base layer may remain in it, or in the cavity, and be freely accessible, in order to apply at least one conductor track to the base layer in the way described below.

The application of the at least one conductor track to the base layer is carried out in a further method step c). According to this method step, one conductor track or multiple conductor tracks or a conducting structure is or are applied at least locally to the base layer, or in particular to a first surface of the base layer. The conductor track or the conductor tracks serves or serve in this case in particular for the purpose of connecting a sensor element that can be fixed on a receiving region of the receptacle, that is to say the actual active part of a sensor capable of detection, for instance for the case where it is used as a combustion chamber pressure sensor, to a controller, evaluation unit or the like arranged outside the combustion chamber. It may in this case also be possible for the application of the at least one conductor track to be realized by methods known per se, such as for instance printing.

For example, the at least one conductor track may be formed from a material that is selected from the group consisting of platinum, palladium or silver-palladium.

In order to overmold the base layer or a surface of the base layer provided with at least one conductor track, and thereby enclose the at least one conductor track in a gas-tight manner, in a further method step d) a further amount of pre-ceramic substance is introduced into an injection mold on at least a partial region of the at least one conductor track. In this case, the further amount that is introduced into the injection mold in this method step may be the same or a different pre-ceramic substance as or from the pre-ceramic substance introduced into the injection mold in method step a). The use of a pre-ceramic substance with the same or substantially the same composition may in particular offer the advantage that a particularly intimate bonding can be produced between the partial regions and, as a result, gas-tight sealing that is also enduring can be particularly ensured. In addition, the use of materials with the same or at least substantially the same coefficients of thermal linear expansion is of advantage in particular, since a sensor receptacle can in this case also be used at high temperatures without the risk of being damaged.

In addition, the further amount of pre-ceramic substance may preferably be introduced into the same injection mold or injection-molding tool, for instance while adapting the cavity used, or be realized in a further injection-molding tool.

In a further method step e), a top region of the receptacle is formed directly on the base layer while at least partially covering over or overmolding the at least one conductor track by molding the further pre-ceramic substance in the injection mold. In other words, with this step, a first mold half with the at least one conductor track can be overmolded by a second mold half. This allows an intimate connection of the materials of the base layer and the top region to one another, such as in particular the ceramic materials to one another, with the high pressure in an injection-molding process being able to have a very favorable effect on the compaction of the component, and consequently on the sealed configuration of the at least one conductor track within the body as a whole. This creates a closed molded part which has conductor tracks that are lying on the inside, faithfully reproduced and outwardly insulated.

In this case, at least partial covering over may mean in particular that the conductor tracks are covered over substantially completely, but at one end of the receptacle both the base layer and the conductor tracks are not covered over by the top region. This region may for instance serve as a connecting region for connector contacting of the sensor or of the sensor receptacle, for instance in relation to an evaluation unit or a control unit.

In a further method step f), the molded element may in particular be sintered. Within the scope of the present disclosure, sintering may mean in particular treatment at an elevated temperature. Suitable temperatures comprise, for example and without implying any restriction, a range of greater than or equal to 1200° C. to less than or equal to 1500° C. Sintering is of advantage in particular for ceramic components, and allows particularly high requirements with respect to dimensional stability and gas-tight sealing even at high operating temperatures.

If applicable, the binder must also be removed from the ceramic material. This can take place by a separate debinding step before the sintering, or else by the effect of the temperature during the sintering, as is known in principle to a person skilled in the art.

The ceramic injection-molding process according to the disclosure consequently has the advantage that the production of the conductor tracks, which may form a functional layer within the receptacle, is completely included in the process of injection molding the ceramic molded body or the receptacle. This makes it possible to dispense with the application of the conducting structure, for instance by printing on or drilling in, to a ceramic body in the course of subsequent processes. The integrated production of a ceramic body and functional layer consequently allows production steps to be omitted, and consequently production costs to be lowered. The method according to the disclosure may also allow functional layers to be arranged on or in ceramic bodies that are also complexly molded, so that measuring elements with ceramic bodies that are dimensionally formed in such a way, and to which printing cannot easily be applied, or not accurately enough, or which entail the risk of being damaged when the conductor tracks are applied by printing, can be produced. This may apply, for example, in the case of surfaces that are convex or rounded in any way desired.

In addition, an enduring bonding of the top layer to the base layer can be ensured by easy adaptation of the materials of the functional layer or of the pre-ceramic substance.

Within the scope of a refinement, a pre-ceramic substance, that is to say the ceramic substance introduced in method step a) and/or e), comprises zirconium dioxide ($ZrO_2$), silicon dioxide ($SiO_2$) and cordierite ($(Mg,Fe^{2+})_2(Al_2Si)^{[4]}$ $[Al_2Si_4O_{18}]$). In particular, the pre-ceramic substance may for instance be formed as a powder mixture and also comprise 30-40% by volume of cordierite, in particular 35% by volume of cordierite. With this amount of cordierite, the coefficient of thermal expansion is exactly matched to the coefficient of thermal expansion of silicon, which, depending on the application, may be advantageous. The exact amount of the added cordierite is determined by the desired coefficient of thermal expansion of the sintered ceramic. Cordierite fractions below 35% by volume may serve for adaptation of the coefficient of thermal expansion to silicon carbide.

For example, the pre-ceramic mixture or the pre-ceramic fraction may comprise zirconium dioxide in a range of greater than or equal to 10% by weight to less than or equal to 55% by weight, silicon dioxide in a range of greater than or equal to 10% by weight to less than or equal to 55% by weight, and/or cordierite in a range of greater than or equal to 5% by weight to less than or equal to 75% by weight. As an example, 49.3% by weight of zirconium dioxide, 27.5% by weight of cordierite and 23.2% by weight of silicon dioxide may be present in the pre-ceramic fraction.

The pre-ceramic fraction is in this case in particular the fraction that contains the substances later reacting to form a ceramic, which together with further substances, such as in particular a binder, forms the pre-ceramic mixture.

For example, the powder mixture may have a maximum grain size D50 of 10 μm, in particular all the particles may have a maximum grain size of 10 μm.

In this refinement it is possible to provide a zirconium silicate/cordierite ceramic that is particularly stable in terms of temperature and pressure, allows good electrical insulation, even at high temperatures, of parallel-running conductor tracks small distances apart and is at the same time very simple and inexpensive.

The ceramic compound thus produced has a very low porosity, and is formed from the starting raw materials $ZrO_2$ and $SiO_2$, the zirconium silicate being formed during the reaction sintering, and including the added, ready-synthesized, fine-ceramic cordierite grains in the microstructure as a third constituent.

The matrix of the completed ceramic thus contains after the sintering the mechanically very stable $ZrSiO_4$ and thus allows a greater strength and hardness in comparison with other materials. Furthermore, in this way a sensor receptacle with a low coefficient of thermal expansion is provided. The addition of cordierite serves for matching the coefficient of thermal expansion of the zirconium silicate/cordierite ceramic to the value of Si or SiC, thereby achieving adaptation of the coefficient of thermal expansion of the sensor carrier to the coefficient of thermal expansion of a sensor element, which generally partially comprises Si and/or SiC.

As a result, mechanical stresses that arise due to different coefficients of thermal expansion of the sensor element and the sensor carrier can be avoided to the greatest extent.

In this case, the pre-ceramic substances used for the base layer and the top region may be the same or different. It is correspondingly possible for single-component ceramic injection-molding processes or a two-component ceramic injection-molding process to be realized.

Within the scope of a further refinement, the at least one conductor track may be applied by what is known as inmold labeling, direct screen printing, an adhesive imaging technique, doctor blading, dispensing or by tampon printing. In the case of inmold labeling, for example, the conductor track may be applied in situ, that is to say during the shaping process, in that the conductor track may, for example, be printed onto a continuous strip and be rolled up on a reel and provided in this form. By inserting the continuous strip into the injection-molding tool, it is possible by means of the strip for the at least one conductor track to be transferred or adhesively attached onto the base layer by means of a sticker-like adhesive technique. After the operation of injection molding the top layer, the continuous strip or carrier strip may be drawn further in a continuous and clock-based manner. This allows particularly short process times to be realized, and allows the production process to be made particularly inexpensive. With respect to tampon printing, the conductor tracks can be printed onto the base layer directly in the injection-molding tool, that is to say without depositioning of the molded part, and finally the complete molded body can be produced by overmolding. A tampon printing method may be understood in this case as meaning in particular an indirect gravure printing method known per se, in which the substance to be printed can be transferred from the printing form to the material to be printed, here the ceramic material, by an elastic tampon, for example formed from silicone rubber. Here, the substance to be printed may be, for example, a quick-drying paste, which can likewise be applied directly to the molding still located in the injection-molding tool. In the case of an adhesive imaging technique, the conductor track may for instance be applied after the shaping.

The aforementioned methods can be processed particularly well, for instance by an automated handling device. In detail, it is possible, for example, for an adhesive image from a continuous strip or a printed image to be applied in an automated manner to the surface of the base layer that has been injection-molded and itself still remains in the tool, that is to say directly in the injection-molding tool.

Within the scope of a further refinement, the base layer may be formed with a surface on which a serration structure is arranged. The bonding of the two partial regions, that is to say the base layer and the top region, to one another can be significantly improved by a serration structure or by a multitude of serration structures. In detail, a particularly stable receptacle, which remains particularly stable even under high temperatures or harsh measuring conditions, such as may prevail for instance in a combustion chamber, can be realized by such a serration. This allows measuring characteristics that are particularly reliable and stable over a long time to be obtained. A serration structure may in this case be a single serration or multiple serrations or components forming a serration. Non-restrictive examples comprise wavy, rectangular, undercut, tongue-and-groove serrations, or else pin structures.

Within the scope of a further refinement, in method step a) and in method step d) the pre-ceramic substance may be introduced into the injection-molding device from an end face thereof. In this refinement, the injection of both component halves may take place from the end face, in particular the same end face, and lead to components that are free from weld lines and free from defects, since a particularly uniform flow front can form. The direction of flow of the compound or of the pre-ceramic substance may in this case be guided in the same direction as the path of the conductor tracks, whereby smearing or shifting of the conductor track structure can be avoided. It is evident in this respect that, in this refinement, even very fine or filigree structures can be transferred particularly reliably into a ceramic body, which can allow usually cost-intensive conductor track material to be saved. As a result, the method according to the present disclosure is possible particularly inexpensively. An end face may in this case be in particular such a face that can form an end side of the receptacle to be formed, with respect to the longitudinal extent of the at least one conductor track.

Within the scope of a further refinement, a pre-ceramic substance, that is to say the ceramic substance introduced in method step a) and/or e), may comprise a binder system that is selected from the group of thermoplastic binder systems, in particular comprising polyvinyl butyral. If applicable, such a binder may comprise additives. In particular, a thermoplastic binder or thermoplastic binder system allows a method according to the disclosure to be performed particularly advantageously. In detail, a thermoplastic binder system makes a connection of the two molded parts formed one after the other, that is to say the base layer and the top region, particularly stable. This is made possible by the fact that a thermoplastic binder system in a liquid or liquefied state, for instance as a result of high temperatures, acts like an adhesive. The aforementioned additives may in this case perform a wide variety of tasks. Polyvinyl butyral or polyvinyl butyral polymers may in this case allow a particularly good bonding effect or adhesive effect of the top layer on the base layer. As a result, the receptacle created may be particularly stable and gas-impermeable.

Within the scope of a further refinement, a pre-ceramic substance, that is to say the ceramic substance introduced in method step a) and/or e), may comprise a polyacrylate. The provision of a polyacrylate or a mixture of polyacrylates, in particular as a constituent of the binder system, can achieve the effect that the pre-ceramic mixture is of low viscosity in the hot state, but glass-hard in the cooled state. This may be particularly advantageous for flawless application of printing to the still warm preform in the injection-molding tool or in the tool half. Suitable polyacrylates comprise, for example, polymethyl methacrylate (PMMA) or polybutyl methacrylate (PBMA).

Within the scope of a further refinement, a pre-ceramic substance, that is to say the ceramic substance introduced in method step a) and/or e), may comprise polyethylene glycol, in particular as a constituent of the binder system. In this refinement, the advantage of particularly good stability during and after the production process may be obtained. In detail, thermal processes that can drive the binders out of the component, such as for example by cracking, are necessary for the transformation of a green state into a ceramic state or into a ceramic component. This is possible in particular with slow temperature control. Thick components, which may for example have a thickness of from 4 mm, require in this case very long process times, which on the one hand is expensive, on the other hand may be conducive to cracks in the interior of the ceramic component. This can be remedied by the water-soluble additive polyethylene glycol, in particular with chain lengths of up to 4000 g per mole, in particular in the binder system. Before the thermal bonding processes, that is to say the debinding and sintering, the components may be placed in a water bath, allowing the polyethylene glycol to dissolve out. This may have the effect of creating intrinsic porosity, which may allow free and accelerated thermal debinding. Furthermore, after the water bath, the binder system then does not have a thermoplastic component, so that the component can no longer soften during the thermal debinding. The component geometry can thus remain unchanged over these processes.

Within the scope of a further refinement, a pre-ceramic substance, that is to say the ceramic substance introduced in method step a) and/or e), may comprise a solids fraction of greater than or equal to 25% to less than or equal to 55%. Such a high solids content has the effect of allowing particularly high dimensional stability of the molded parts created, or a good mutual bonding capability of the molded parts injection-molded one after the other, in particular after the sintering. Such solids contents can be set in a suitable way with a dispersing agent as an aid. The dispersing agent may in this case bring about an ideal homogenization of the molded parts. Suitable dispersing agents may comprise, for example, carboxylic acids, carboxylic acid esters or triethanolamine-based systems, such as for example on the basis of a triethanolamine carboxylic acid ester.

With regard to further features and advantages of the method according to the disclosure for producing a receptacle, reference is hereby made explicitly to the explanations in connection with the method according to the disclosure for producing a sensor arrangement, the receptacle according to the disclosure, the figures and the description of the figures.

The subject matter of the present disclosure is also a method for producing a sensor arrangement, comprising a method as described above for producing a receptacle, the method comprising the further step of:
  g) applying a sensor element to a receiving region of the receptacle.

Such a method allows a receptacle which has a conductor track or multiple conductor tracks that run in particular in a gas-tight manner in the interior of the receptacle, in particular ceramic receptacle, to be created in a particularly easy and inexpensive way. The receptacle may in this case be configured as described above. Thereafter, the sensor element, such as for instance a computer chip or a further sensor element, known for instance as a pressure sensor, may be applied in an easy way to the receiving region and fastened there. Fastening may in this case take place in particular by methods known per se, such as for example glazing on or (vacuum) brazing.

With regard to further features and advantages of the method according to the disclosure for producing a sensor arrangement, reference is hereby made explicitly to the explanations in connection with the method according to the disclosure for producing a receptacle, the receptacle according to the disclosure, the figures and the description of the figures.

The subject matter of the present disclosure is also a receptacle for a sensor element, produced according to a method as described above for producing a receptacle. Such a receptacle can be created by a few inexpensive production steps and also has in this case a conductor track or multiple conductor tracks that run in particular in a gas-tight manner in the interior of the receptacle, in particular ceramic receptacle.

With regard to further features and advantages of the receptacle according to the disclosure, reference is hereby made explicitly to the explanations in connection with the method according to the disclosure, the figures and the description of the figures.

BRIEF DESCRIPTION OF THE DRAWINGS

Further advantages and advantageous refinements of the subjects according to the disclosure are illustrated by the drawings and are explained in the description that follows. It should be noted here that the drawings are only of a descriptive character and are not intended to restrict the disclosure in any form. In the drawings.

DETAILED DESCRIPTION

Figure 1:
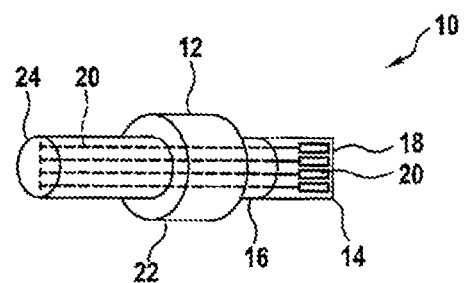
FIG. 1 shows a schematic representation of an embodiment of a receptacle produced by the method according to the disclosure.
Figure 2:
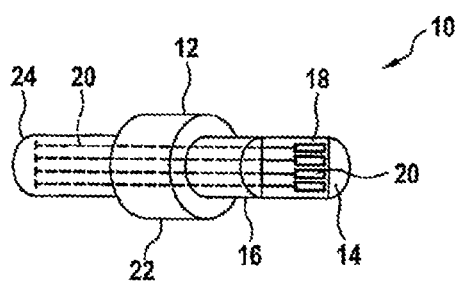
FIG. 2 shows a further schematic representation of the embodiment from FIG. 1.

In FIG. 1, a receptacle 10 that can be produced according to the method according to the disclosure is shown. It may be used, for example, in a directly measuring combustion chamber pressure sensor at operating temperatures of 500° C. or even above.

Such a receptacle 10 comprises a ceramic body 12, which is constructed in particular from multiple partial regions, to be specific a base layer 14 and a top layer 16. The base layer 14 and the top layer 16 are in this case fastened to one another in a pressure-tight manner. Within the ceramic body 12, such a receptacle 10 has a receiving region 24, to or on which a sensor element may be fastened. From the receiving region 24, a conductor track 20 or multiple conductor tracks 20 runs or run through the interior of the ceramic body 12 for the electrical contacting of a sensor element fastened to the receiving region 24. In detail, the conductor track 20 or conductor tracks 20 runs or run on the boundary between the base layer 14 and the top layer 16.

A receptacle 10 also comprises a fixing means 22, which can facilitate installation of the receptacle 10 into a combustion chamber or into a combustion chamber wall. In this case, the receptacle 10 or the receiving region 24 may for instance be arranged such that the receiving region 24 together with a sensor element can protrude into the combustion chamber, but an end region 18 remote from the receiving region 24 can protrude out of the combustion chamber, for instance for the electrical contacting.

A receptacle 10 as described above may be produced in particular by the following method steps. Firstly, a first amount of a pre-ceramic substance is introduced into an injection mold 26. The pre-ceramic substance may comprise in particular zirconium dioxide, silicon dioxide and cordierite. In this case, the pre-ceramic substance may comprise a binder that is selected from the group of thermoplastic binder systems, in particular comprising polyvinyl butyral or polyvinyl butyral polymers. The pre-ceramic substance may comprise for instance, as additives of the binder, a polyacrylate and/or polyethylene glycol. For example, the pre-ceramic substance may have a solids fraction of less than or equal to 63% by volume. In an actual exemplary embodiment given by way of example, a pre-ceramic substance or mixture of which the ratio of the pre-ceramic fraction to the binder fraction is 4.5:1 may be used. In this case, the pre-ceramic fraction may comprise zirconium dioxide in a range of greater than or equal to 10% by weight to less than or equal to 55% by weight, silicon dioxide in a range of greater than or equal to 10% by weight to less than or equal to 55% by weight, and/or cordierite in a range of greater than or equal to 5% by weight to less than or equal to 75% by weight. Furthermore, the binder fraction or the binder system may comprise or consist of polyvinyl butyral in a content of greater than or equal to 10% to less than or equal to 25%, polyacrylate in a content of greater than or equal to 15% to less than or equal to 35%, polyethylene glycol in a content of greater than or equal to 35% to less than or equal to 60%, and triethanolamine carboxylic acid ester in a content of greater than or equal to 5% to less than or equal to 20%.

Figure 3A:
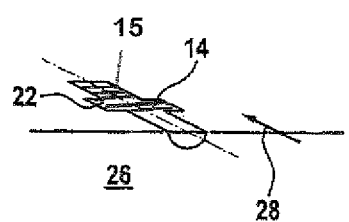
FIG. 3a shows a method step of the method according to the disclosure.

By molding of the pre-ceramic substance introduced into the injection mold 26, a base layer 14, or the green body of the base layer 14, can be created thereafter in the injection mold 26. This is shown in FIG. 3a. It can be seen in FIG. 3a that the green body of the base layer 14 remains in the injection mold 26. In this case, the base layer 14 or the green body can be molded with a surface on which a serration structure 15 is arranged.

Figure 3B:
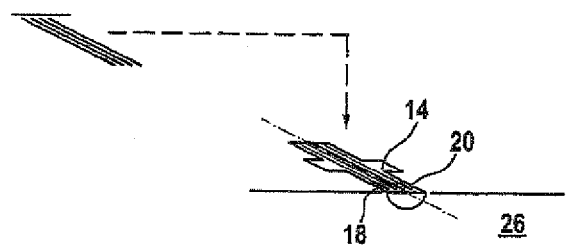
FIG. 3b shows a further method step of the method according to the disclosure.

Following that, at least one conductor track 20 may be applied to the base layer 14 or to the green body of the base layer 14. This step is schematically shown in FIG. 3b. In detail, the application of one or more conductor tracks 20 may be realized, for example, by inmold labeling, direct screen printing, an adhesive imaging technique, doctor blading, dispensing or tampon printing.

Figure 4:
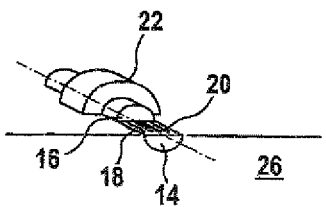
FIG. 4 shows a further schematic representation of an embodiment of a receptacle produced by the method according to the disclosure in an injection mold.

After the application of the at least one conductor track 20, in a further method step a further amount of a pre-ceramic substance is introduced into an injection mold 26 on a partial region of the at least one conductor track 20. Like the introduction of the first amount of pre-ceramic substance, this may be realized from the end face of the injection-molding device 26, into the latter as shown by the arrow 28. As a further step, the forming of a top region 16, or a green body of the top region 16, of the receptacle 10 takes place directly on the base layer 14, while at least partially covering over the at least one conductor track 20 by molding of the further pre-ceramic substance in the injection mold 26. This is schematically represented in FIG. 4.

Following that, the molded body may be sintered, in order to obtain a receptacle 10 that is gas-tight and stable over a long time. In order to create a sensor arrangement, the method may comprise the further step of: g) applying a sensor element to the receiving region 24.

What is claimed is:

1. A method for producing a receptacle for a sensor element, comprising:
    introducing a first amount of a pre-ceramic substance into an injection mold;
    forming a base layer of the receptacle by molding the pre-ceramic substance in the injection mold;
    applying at least one conductor track to the base layer;
    introducing a further amount of the pre-ceramic substance into the same injection mold onto at least a partial region of the base layer and of the at least one conductor track;
    forming a top region of the receptacle directly on the base layer while at least partially covering over the at least one conductor track by molding the further pre-ceramic substance in the injection mold, to form a molded body; and
    debinding and sintering the molded body.

2. The method according to claim 1, wherein the pre-ceramic substance comprises zirconium dioxide, silicon dioxide, and cordierite.

3. The method according to claim 1, wherein the at least one conductor track is applied by inmold labeling, direct screen printing, an adhesive imaging technique, doctor blading, dispensing, or tampon printing.

4. The method according to claim 1, wherein the base layer is formed with a surface on which a serration structure is arranged.

5. The method according to claim 1, wherein the pre-ceramic substance is introduced into an injection-molding device for the injection mold from an end face thereof.

6. The method according to claim 1, wherein the pre-ceramic substance comprises a binder system that is a thermoplastic binder system.

7. The method according to claim 6, wherein the binder system includes polyvinyl butyral.

8. The method according to claim 1, wherein the pre-ceramic substance comprises a polyacrylate.

9. The method according to claim 1, wherein the pre-ceramic substance comprises polyethylene glycol.

10. The method according to claim 1, wherein the pre-ceramic substance comprises a solids fraction of less than or equal to 55%.

11. The method according to claim 1, wherein the receptacle is configured for a combustion chamber pressure sensor.

12. The method according to claim 1, wherein at least the steps of introducing a first amount, forming a base layer, applying at least one conductor track, and introducing a further amount occur in sequence.

13. A method for producing a sensor arrangement, comprising:
    introducing a first amount of a pre-ceramic substance into an injection mold;
    forming a base layer of a receptacle for a sensor element by molding the pre-ceramic substance in the injection mold;
    applying at least one conductor track to the base layer;
    introducing a further amount of the pre-ceramic substance into the same injection mold onto at least a partial region of the base layer and of the at least one conductor track;
    forming a top region of the receptacle directly on the base layer while at least partially covering over the at least one conductor track by molding the further pre-ceramic substance in the injection mold, to form a molded body;
    debinding and sintering the molded body; and
    applying a sensor element to a receiving region of the receptacle.

14. The method according to claim 13, wherein at least the steps of introducing a first amount, forming a base layer, applying at least one conductor track, and introducing a further amount occur in sequence.

* * * * *